US011203245B2

(12) United States Patent
Kojima et al.

(10) Patent No.: US 11,203,245 B2
(45) Date of Patent: Dec. 21, 2021

(54) DRIVE CIRCUIT ANOMALY DIAGNOSING DEVICE

(71) Applicant: KYB CORPORATION, Tokyo (JP)

(72) Inventors: Hiroyuki Kojima, Tokyo (JP); Koichiro Awano, Tokyo (JP)

(73) Assignee: KYB CORPORATION, Tokyo (JP)

( * ) Notice: Subject to any disclaimer, the term of this patent is extended or adjusted under 35 U.S.C. 154(b) by 147 days.

(21) Appl. No.: 16/491,384

(22) PCT Filed: Jul. 13, 2018

(86) PCT No.: PCT/JP2018/026423
§ 371 (c)(1),
(2) Date: Sep. 5, 2019

(87) PCT Pub. No.: WO2019/021849
PCT Pub. Date: Jan. 31, 2019

(65) Prior Publication Data
US 2020/0023706 A1    Jan. 23, 2020

(30) Foreign Application Priority Data

Jul. 26, 2017 (JP) .............................. JP2017-144386

(51) Int. Cl.
*B60G 17/0185* (2006.01)
*H01F 7/18* (2006.01)
*H03K 17/0812* (2006.01)

(52) U.S. Cl.
CPC ....... *B60G 17/0185* (2013.01); *H01F 7/1844* (2013.01); *H03K 17/0812* (2013.01); *B60G 2204/62* (2013.01); *B60G 2600/08* (2013.01)

(58) Field of Classification Search
CPC ............ B60G 17/0185; B60G 2204/62; B60G 260/08; H03K 17/0812; H01F 7/1844
See application file for complete search history.

(56) References Cited

U.S. PATENT DOCUMENTS 5,251,091 A    10/1993   Ito et al.
5,490,031 A *   2/1996   Braun .................. H01F 7/1805
                                                         361/93.1
(Continued)

FOREIGN PATENT DOCUMENTS

CN    103262186 A    8/2013
CN    107851537 A    3/2018
(Continued)

OTHER PUBLICATIONS

Jan. 6, 2021, Chinese Office Action issued for related CN application No. 201880046142.8.
(Continued)

*Primary Examiner* — Thienvu V Tran
*Assistant Examiner* — Bart Iliya
(74) *Attorney, Agent, or Firm* — Paratus Law Group, PLLC

(57) ABSTRACT

A drive circuit anomaly diagnosing device of the present invention performs an anomaly diagnosis on a drive circuit including a power supply line on which a solenoid is disposed midway, a main switch disposed on the power source side relative to the solenoid, a first diode disposed on a protection line connecting a point between the main switch and the solenoid to ground with a forward direction corresponding to a direction from the ground side to the power source side, and a first capacitor interposed on a first line connecting a point between the protection line and the solenoid to the ground midway on the power supply line, the drive circuit being configured to supply power to the solenoid, on the basis of a current detected by a first current sensor disposed upstream of the main switch on the power supply line.

6 Claims, 5 Drawing Sheets

(56) References Cited

U.S. PATENT DOCUMENTS

| | | | | |
|---|---|---|---|---|
| 5,975,057 A | * | 11/1999 | Repplinger | F02D 41/20 123/490 |
| 2012/0106019 A1 | | 5/2012 | Buxton | |
| 2017/0218876 A1 | | 8/2017 | Kusakabe et al. | |
| 2018/0141506 A1 | * | 5/2018 | Yamashita | B60R 16/02 |
| 2018/0201209 A1 | | 7/2018 | Jyumonji | |

FOREIGN PATENT DOCUMENTS

| | | |
|---|---|---|
| JP | H04-050550 A | 2/1992 |
| JP | H10-096480 A | 4/1998 |
| JP | 2000-293201 A | 10/2000 |
| JP | 2005-158870 A | 6/2005 |
| JP | 2007-027465 A | 2/2007 |
| JP | 2009-283719 A | 12/2009 |
| JP | 2010-022915 A | 2/2010 |
| JP | 2013-159204 A | 8/2013 |
| JP | 2015-191974 A | 11/2015 |
| JP | WO 2017/006996 A1 | 1/2017 |
| WO | WO 2013/191267 A1 | 12/2013 |
| WO | WO 2015/182294 A1 | 12/2015 |

OTHER PUBLICATIONS

Jun. 8, 2021, Japanese Office Action issued for related JP application No. 2017-144386.
Mar. 23, 2021, Japanese Office Action issued for related JP application No. 2017-144386.

\* cited by examiner

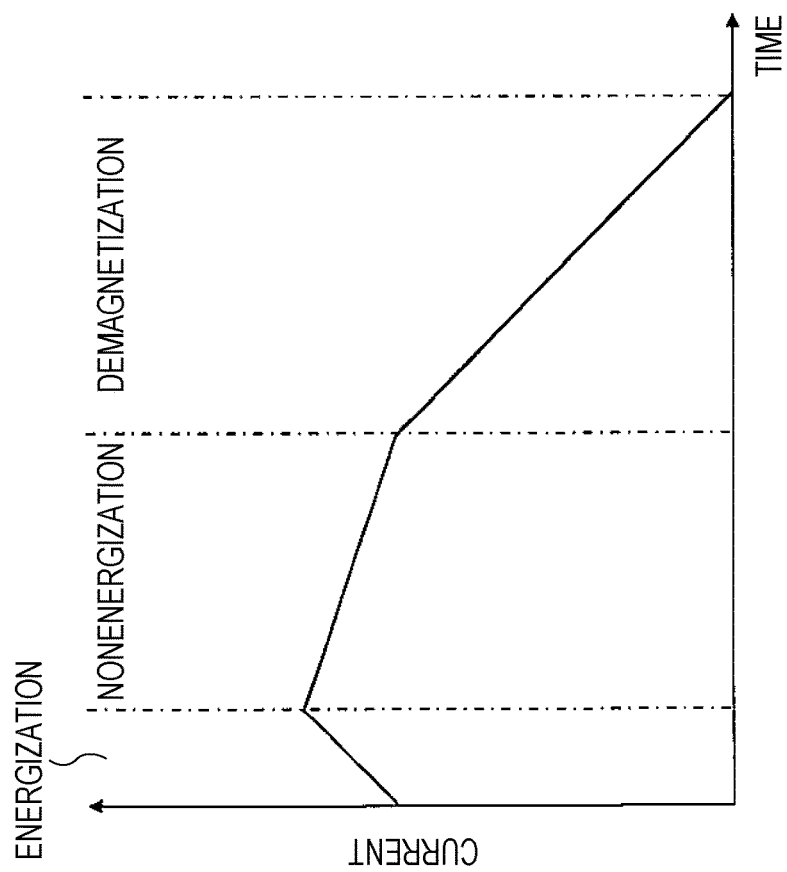

DRIVE CIRCUIT ANOMALY DIAGNOSING DEVICE

CROSS REFERENCE TO PRIOR APPLICATION

This application is a National Stage Patent Application of PCT International Patent Application No. PCT/JP2018/026423 (filed on Jul. 13, 2018) under 35 U.S.C. § 371, which claims priority to Japanese Patent Application No. 2017-144386 (filed on Jul. 26, 2017), which are all hereby incorporated by reference in their entirety.

TECHNICAL FIELD

The present invention relates to a drive circuit anomaly diagnosing device.

BACKGROUND ART

There is a suspension system including a damping adjustable shock absorber which is interposed between a body and a rear wheel of a vehicle to adjust a damping force to improve the ride quality in the vehicle. The shock absorber used in such a suspension system may include a damping valve which applies a resistance to the flow of hydraulic oil flowing between an extension side chamber and a pressure side chamber during expansion and contraction and change the resistance in the damping valve to adjust the damping force.

Such a damping valve is, for example, a solenoid valve whose opening pressure or opening degree is adjustable by a solenoid, and the damping force of the shock absorber is controlled by adjusting current flowing through the solenoid.

For power supply to a solenoid, for example, JP 2010-22915 A discloses a drive circuit provided with a power supply line which connects a power source to a solenoid, a switch which is disposed on the power supply line, and a diode which is disposed in parallel to the solenoid to relieve a surge.

SUMMARY OF THE INVENTION

As described above, the drive circuit is provided with the diode in addition to the switch. Thus, when the diode is short-circuited due to an overcurrent or overvoltage, power cannot be normally supplied to the solenoid.

Thus, in a case where the damping force is controlled by adjusting the resistance of the solenoid valve of the shock absorber in the drive circuit, when the diode is snort-circuited, the damping force cannot be appropriately controlled, which deteriorates the ride quality of the vehicle. In detection of such an anomaly, a system that performs a self-diagnosis on startup when the power is turned on may be used. However, in the case of a vehicle or the like, since it is not desirable to continue travelling without recognizing an anomalous condition, an anomaly diagnosing device capable of detecting an anomaly even while the drive circuit is driving the solenoid is demanded.

Thus, it is an object of the present invention to provide a drive circuit anomaly diagnosing device capable of performing an anomaly diagnosis even during the driving of a solenoid.

In order to achieve the above object, a drive circuit anomaly diagnosing device of the present invention performs an anomaly diagnosis on a drive circuit including a power supply line on which a solenoid is disposed midway, a main switch disposed on the power source side relative to the solenoid, a first diode disposed on a protection line connecting a point between the main switch and the solenoid to ground with a forward direction corresponding to a direction from the ground side to the power source side, and a first capacitor interposed on a first, line connecting a point between the protection line and the solenoid to the ground midway on the power supply line, the drive circuit being configured to supply power to the solenoid, on the basis of a current detected by a first current sensor disposed upstream of the main switch on the power supply line.

BRIEF DESCRIPTION OF DRAWINGS

FIG. 5 is a diagram illustrating the progression of a current flowing through a solenoid of a drive circuit to which the drive circuit anomaly diagnosing device in the second embodiment is applied.

DESCRIPTION OF EMBODIMENTS

Figure 1:
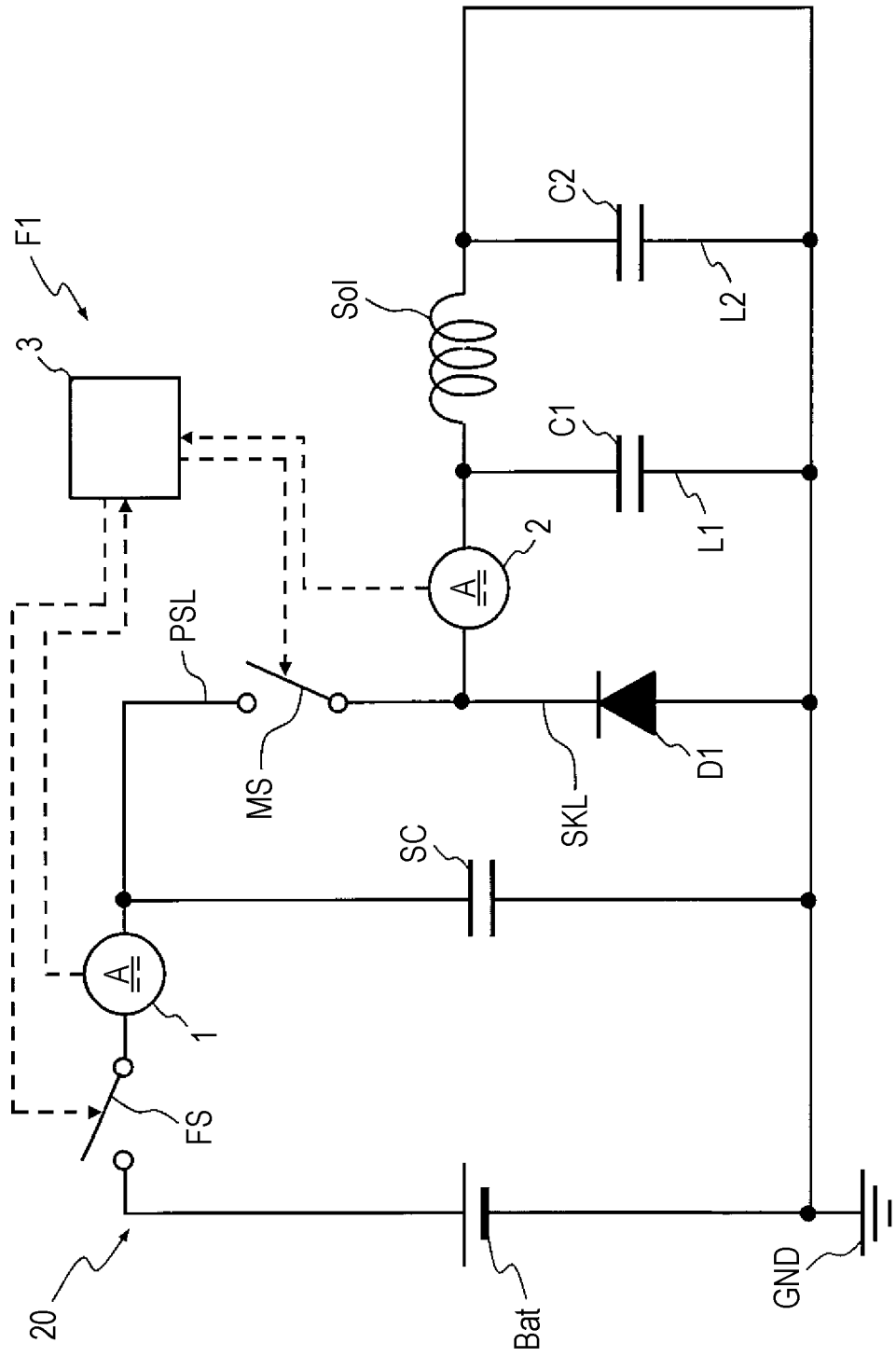
FIG. 1 is a configuration diagram of a drive circuit anomaly diagnosing device in a first embodiment.

Hereinbelow, the present invention will be described on the basis of embodiments illustrated in the drawings. Note that, in the following description, common configurations between a drive circuit anomaly diagnosing device F1 in a first embodiment and a drive circuit anomaly diagnosing device F2 in a second embodiment are designated by the same reference signs, and a configuration described in the drive circuit anomaly diagnosing device F1 of the first embodiment will not be described in detail in the drive circuit anomaly diagnosing device F2 in the second embodiment to avoid redundant description.

First Embodiment

As illustrated in FIG. 1, the drive circuit anomaly diagnosing device F1 of the first embodiment is provided with a first current sensor 1, a second current sensor 2, and a controller 3 as a diagnosing unit which diagnoses the presence or absence of an anomaly on the basis of currents detected by the first current sensor 1 and the second current sensor 2 to detect an anomaly of a drive circuit 20.

Hereinbelow, the drive circuit anomaly diagnosing device F1 of the present example and the drive circuit 20 to which the anomaly diagnosing device F1 is applied will be described in detail. First, the drive circuit will be described. As illustrated in FIG. 1, the drive circuit 20 supplies power to a solenoid Sol by PWM control. As illustrated in FIG. 1, the drive circuit 20 is provided with a power supply line PSL which connects one end of the solenoid Sol to a power source Bat and connects the other end of the solenoid Sol to ground GND, a main switch MS which includes an N-channel MOSFET disposed between the solenoid Sol and the power source Bat midway on the power supply line PSL, a protection line SKL which connects a part of the power supply line PSL between the main switch MS and the solenoid Sol to the ground GND, a first diode D1 which is interposed midway on the protection line SKL with a forward direction corresponding to the direction from the ground side to the power source side, a first line L1 and a second line L2 which connect both sides of the solenoid Sol to the ground GND midway on the power supply line PSL, a first capacitor C1 for noise reduction which is disposed on the first line L1, a second capacitor C2 for noise reduction which is disposed on the second line L2, a fail switch FS which is disposed on the power source Bat side relative to the protection line SKL on the power supply line PSL, and a smoothing capacitor SC which is interposed between a point between the fail switch FS and the protection line SKL and the ground GND. The main switch MS may include a P-channel MOSFET.

The drive circuit 20 configured in this manner is capable of supplying power to the solenoid Sol from the power source Bat by closing the fail switch FS and the main switch MS, and power supply from the power source Bat to the solenoid Sol is cut off by opening the fail switch FS or the main switch MS. When the main switch MS is opened from a state in which the fail switch FS and the main switch MS are closed so that power is supplied to the solenoid Sol, a counter electromotive force is generated in the solenoid Sol, but the protection line SKL and the first diode D1 function as a surge killer. Thus, the occurrence of a surge in the solenoid Sol is prevented, and a current flowing through the solenoid Sol slowly drops.

Figure 2:
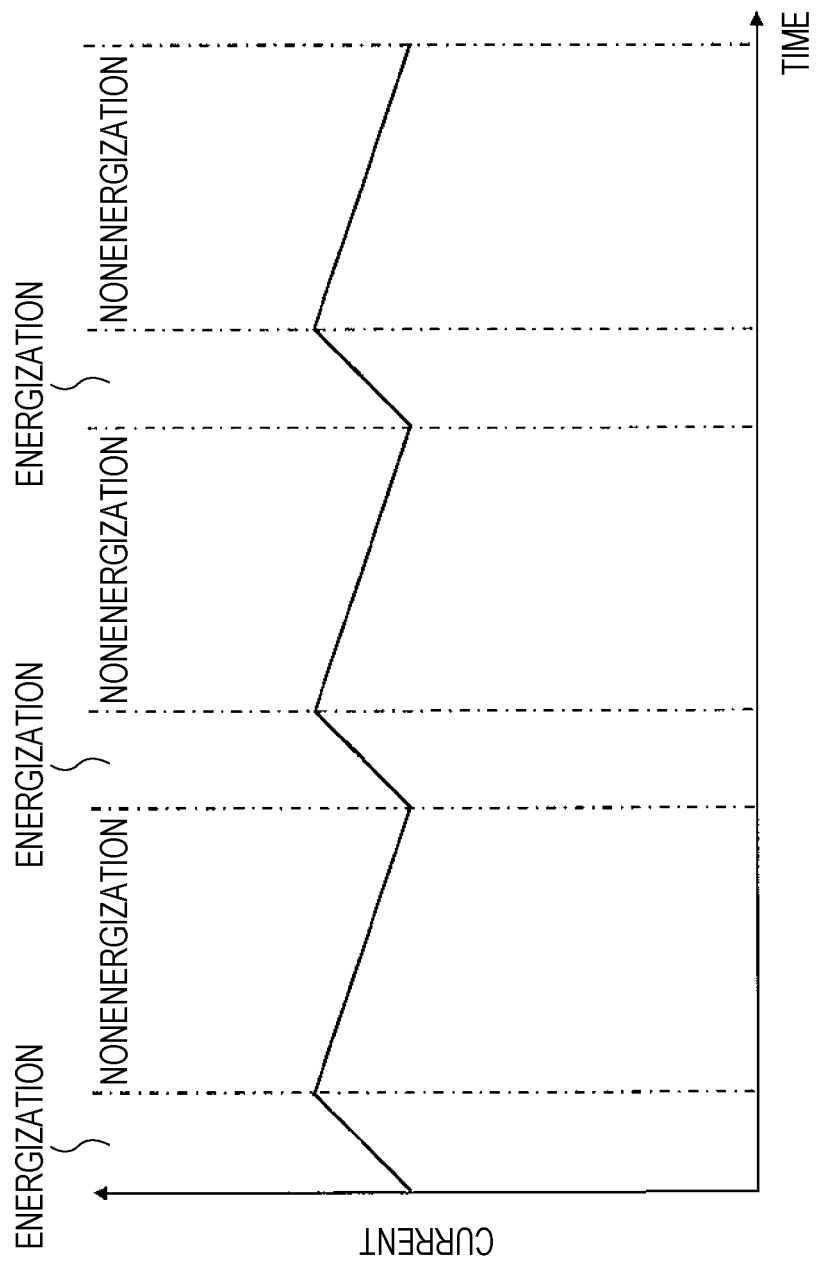
FIG. 2 is a diagram illustrating the progression of a current flowing through a solenoid of a drive circuit to which the drive circuit anomaly diagnosing device in the first embodiment is applied.

Specifically, as illustrated in FIG. 2, a voltage is applied to the solenoid Sol to increase current by turning on the main switch MS with the fail switch FS kept on to energize the solenoid Sol, and the current flowing through the solenoid Sol is gradually reduced by turning off the main switch MS. Thus, current adjustment may be performed by opening or closing the main switch MS according to a desired current to be passed to the solenoid Sol.

Further, the drive circuit 20 is provided with the controller 3 which controls opening and closing of the main switch MS in response to input of a control command from an external control device (not illustrated). Thus, when a control command is given to the controller 3 from the external control device (not illustrate), the controller 3 turns on the fail switch FS and controls opening and closing of the main switch MS to apply a voltage to the solenoid Sol so that a current value in the solenoid Sol becomes a current value designated by the control command. In order to adjust the voltage applied to the solenoid Sol so as to achieve the current value as per the control command, the controller 3 sets an ON duty ratio of the main switch MS to open or close the main switch MS so that the current flowing through the solenoid Sol is as per the control command. In this manner, the drive circuit 20 adjusts the voltage applied to the solenoid Sol by opening and closing the main switch MS by PWM control to control the current flowing through the solenoid Sol. Since a voltage fed to the main switch MS side from the power source Bat is smoothed by the smoothing capacitor SC, the voltage applied to the solenoid Sol can be accurately controlled even when an output voltage of the power source Bat varies.

The anomaly diagnosing device F1 is provided with the first current sensor 1 which detects a current upstream of the main switch MS midway on the power supply line PSL, the second current sensor 2 which detects a current between a connection point of the protection line SKL and a connection point of the first line L1 midway on the power supply line PSL, and the controller 3 as the diagnosing unit which diagnoses the presence or absence of an anomaly on the basis of the currents detected by the first current sensor 1 and the second current sensor 2.

The controller 3 compares a current I1 detected by the first current sensor 1 with a short-circuit current threshold I$\alpha$, and diagnoses that there is an anomaly and immediately turns off the fail switch FS when the current I1 is equal to or higher than the short-circuit current threshold I$\alpha$. Further, also when the current I1 detected by the first current sensor 1 is less than the short-circuit, current, threshold I$\alpha$, but equal to or higher than a first current threshold I$\beta$, the controller 3 diagnoses that there is an anomaly. When the current I1 detected by the first current sensor 1 is less than the first current threshold I$\beta$, the controller 3 diagnoses that there is no anomaly.

When the current I1 is less than the short-circuit current threshold I$\alpha$ and equal to or higher than the first current threshold I$\beta$, and the controller 3 thus diagnoses that there is an anomaly, the controller 3 compares a current I2 detected by the second current sensor 2 with a second current threshold I$\gamma$. The controller 3 diagnoses the first diode D1 as having an anomaly when the current I2 is less than the second current threshold I$\gamma$ in the comparison and diagnoses the first capacitor C1, the solenoid Sol, or the main switch MS as having an anomaly when the current I2 is equal to or higher than the second current threshold I$\gamma$ in the comparison. The short-circuit current threshold I$\alpha$ is a threshold for determining whether the drive circuit 20 has an anomaly and the line on the power source Bat side relative to the solenoid Sol is short-circuited (shorted out) to the ground GND. The controller 3 compares the current I1 with the short-circuit current threshold I$\alpha$, and determines that there is a short circuit in the drive circuit 20 (short-circuit determination) when the current I1 is equal to or higher than the short-circuit current threshold I$\alpha$. The first current threshold I$\beta$ is additionally set for the current I1 detected by the first current sensor 1. The first current threshold I$\beta$ is a threshold for detecting an anomaly of an element or the like, and used for detecting a short circuit in the first diode D1, the first capacitor C1, the solenoid Sol, and the main switch MS. Further, the second current threshold I$\gamma$ is used for identifying an anomalous location in the drive circuit 20 by the comparison with the current I2.

Further, the short-circuit current threshold I$\alpha$ is a threshold for short-circuit determination when the line on the power source Bat side relative to the solenoid Sol in FIG. 1 is short-circuited to the ground GND, and thus set to a value larger than the second current threshold I$\gamma$ and the first current threshold I$\beta$. In the present example, the drive circuit 20 is used in driving of the solenoid Sol of a damping force adjusting valve of a shock absorber which is mounted on a vehicle, and the voltage of the power source Bat is 12V, Thus, the short-circuit current threshold I$\alpha$ is set at 30A, the second current threshold I$\gamma$ is set at 3A, and the first current threshold I$\beta$ is set at 4A.

Further, the controller 3 immediately determines that there is an anomaly when the current I1 detected by the first current sensor 1 exceeds the short-circuit current threshold I$\alpha$ even momentarily, but, on the other hand, determines that there is an anomaly when the current I1 is continuously maintained equal to or higher than the first current threshold I$\beta$ for a predetermined time in the comparison between the current I1 and the first current threshold I$\beta$.

Further, the controller 3 is capable of controlling opening and closing of the main switch MS and the fail switch FS. When the current I1 detected by the first current sensor 1 exceeds the short-circuit current threshold I$\alpha$ even momentarily, the controller 3 immediately determines that there is an anomaly, and turns off the fail switch FS and also turns off the main switch MS. Further, when the controller 3 determines that there is an anomaly in the comparison between the current I1 and the first current threshold Iβ and the comparison between the current I2 and the second current threshold Iγ, the controller 3 turns off the fail switch FS and the main switch MS.

When the first diode D1 and the first capacitor C1 are normal, a current flows to the solenoid Sol by turning on the fail switch FS and the main switch MS. Thus, the current I1 detected by the first current sensor 1 has a value proportional to the voltage applied the solenoid Sol, the voltage being adjusted by PWM control. However, when the first diode D1 or the first capacitor C1, or both the first diode D1 and the first capacitor C1 are damaged and short-circuited, the power source Bat is grounded to the ground GND by the protection line SKL or the first line L1 by turning on the fail switch FS and the main switch MS. Under such a condition, a large current flows through the power supply line PSL, and the protection line SKL or the first line L1. When the first diode D1 is abnormal and the first capacitor C1 is normal, a large current flows through the protection line SKL. When the first diode D1 is normal and the first capacitor C1 is abnormal, a large current flows through the first line L1. The short-circuit current threshold Iα is set at a large current value that is not generated when a current flows to the solenoid Sol during normal control and set at 30A in the present example.

Thus, the current I1 detected by the first current sensor 1 is equal to or higher than the short-circuit current threshold Iα or equal to or higher than the first current threshold Iβ, it is recognized that any one or more of the first diode D1, the first capacitor C1, the solenoid Sol, and the main switch MS have an anomaly and the power source Bat is short-circuited to the ground GND. Thus, as described above, the controller 3 makes a short-circuit determination and diagnoses the drive circuit 20 as having an anomaly. The controller 3 immediately turns off the fail switch FS in accordance with the short-circuit determination to prevent an over current from flowing toward the solenoid Sol from the power source Bat and also turns off the main switch MS.

Further, the controller 3 diagnoses that there is an anomaly also when the current I1 is less than the short-circuit current threshold Iα and a short-circuit determination is thus not made, but the current I1 is equal to or higher than the first current threshold Iβ. When the current I2 detected by the second current sensor 2 is less than the second current threshold Iγ under such a condition, it can be recognized that a large current flows through the protection line SKL. Thus, the controller 3 diagnoses the first diode D1 as having an anomaly as described above.

When the current I2 detected by the second current sensor 2 is equal to or higher than the second current threshold Iγ under the condition where the current I1 is less than the short-circuit current threshold Iα and equal to or higher than the first current threshold Iβ, and the controller 3 thus diagnoses that there is an anomaly, it can be recognized that a large current flows through the first line L1. In this case, since the first capacitor C1, the solenoid Sol, or the main switch MS is short-circuited and the large current thus flows, the controller 3 diagnoses the first capacitor C1, the solenoid Sol, or the main switch MS as having an anomaly as described above. Although, in the above description, an anomaly diagnosis based on the current I2 detected by the second current sensor 2 is performed after an anomaly diagnosis based on the current I1 detected by the first current sensor 1 is performed, an anomaly diagnosis may be performed by simultaneously performing comparisons of the current I1 and the current I2 without performing a stepwise anomaly diagnosis.

Further, when the current I1 is continuously maintained equal to or higher than the first current threshold Iβ for a predetermined time or when the current I2 is continuously maintained equal to or higher than the second current threshold Iγ for a predetermined time in spite of the fact that current supply to the solenoid Sol is stopped by turning off the main switch MS although the fail switch FS is on, but, the controller 3 determines that the main switch MS has an anomaly. Then, the controller 3 turns off the main switch MS and the fail switch FS. In this anomalous mode, although there is a high possibility that the main switch MS cannot be turned off, the controller 3 outputs a signal for turning off the main switch MS.

The first current threshold Iβ is set at a value larger than the second current threshold Iγ due to the reason described below. In the present example, the second current sensor 2, which detects the current flowing through the solenoid Sol, the current being used in control of the applied voltage by the controller 3, has a higher current detection accuracy than the first current sensor 1. Thus, the first current threshold Iβ for the current I1 detected by the first current sensor 1 is increased to prevent erroneous anomaly detection. The second current threshold Iγ and the first current threshold Iβ may be set at the same value. In this case, it is recommended that the current detection accuracy be made equal between the first current sensor 1 and the second current sensor 2.

As described above, according to the drive circuit anomaly diagnosing device F1 of the present invention, the controller 3 performs an anomaly diagnosis on the basis of the current detected by the first current sensor 1. Thus, even while the drive circuit 20 is driving the solenoid Sol, it is possible to diagnose the presence or absence of an anomaly in the drive circuit 20.

Thus, the drive circuit anomaly diagnosing device F1 of the present invention is most suitable for anomaly diagnosis on a drive circuit of a solenoid valve which is used in a shock absorber with a damping force adjusting function used in a suspension in a vehicle and capable of timely detecting an anomaly during traveling of the vehicle. In the case of application to a vehicle, when the anomaly diagnosing device F1 detects an anomaly, the anomaly diagnosing device F1 may send a command for stopping control to the control device which controls the drive circuit 20, or may turn on a warning light or generate an alarm sound so that an occupant of the vehicle recognizes the anomaly.

Further, the drive circuit anomaly diagnosing device F1 of the present example diagnoses the presence or absence of an anomaly in the drive circuit 20 on the basis of the currents detected by the first current sensor 1 and the second current sensor 2. Thus, it is possible to determine the presence or absence of an anomaly in the first diode D1, the first capacitor C1, the solenoid Sol, or the main switch MS.

Further, the anomaly diagnosing device F1 of the present example diagnoses the first diode D1 as having an anomaly when the current I1 detected by the first, current sensor 1 is equal to or higher than the first current threshold Iβ and the current I2 detected by the second current sensor 2 is lower than the second current threshold Iγ. When the anomaly diagnosing device F1 is configured in this manner, it is possible to identify and diagnose an anomaly of the first diode D1 in the drive circuit 20.

Further, the anomaly diagnosing device F1 of the present example diagnoses any of the first capacitor C1, the solenoid Sol, and the main switch MS as having an anomaly when the current. I1 detected by the first current sensor 1 is equal to or higher than the first current threshold Iβ and the current I2 detected by the second current sensor 2 is equal to or higher than the second current threshold Iγ. When the anomaly diagnosing device F1 is configured in this manner, it is possible to determine the presence or absence of an anomaly of the first capacitor C1, the solenoid Sol, or the main switch MS in the drive circuit 20.

Further, when an anomaly of the drive circuit 20 is recognized, the controller 3 achieves fail-safe by turning off the fail switch FS and the main switch MS. In the configuration provided with the fail switch FS as described above, even when the main switch MS has a failure, it is possible to achieve fail-safe by the fail switch FS. Further, even in the situation where either the fail switch FS or the main switch MS is short-circuited, it is possible to reliably prevent an overcurrent from flowing through the solenoid Sol.

Second Embodiment

Figure 3:
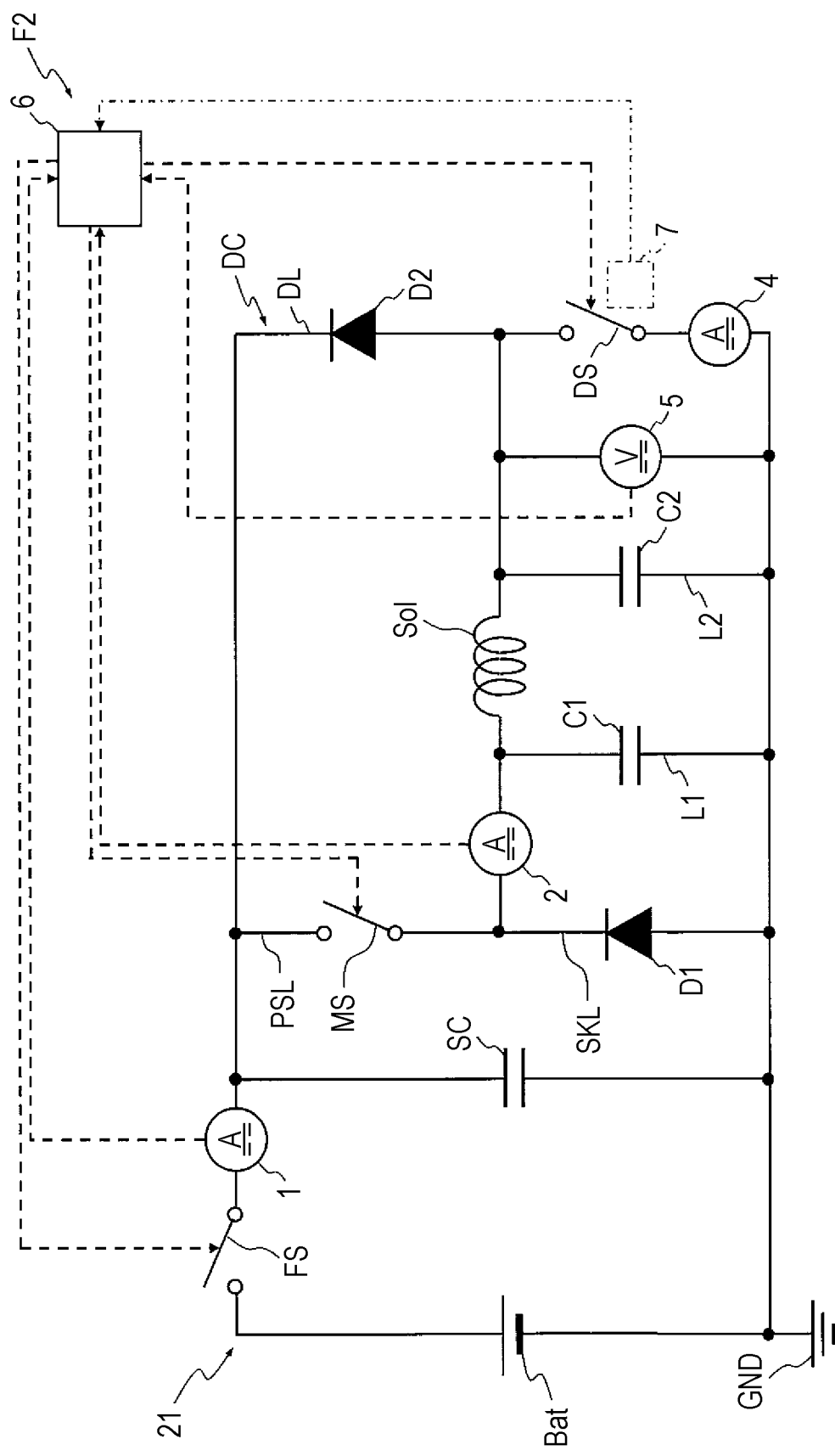
FIG. 3 is a configuration diagram of a drive circuit anomaly diagnosing device in a second embodiment.

As illustrated in FIG. 3, the drive circuit anomaly diagnosing device F2 of the second embodiment is provided with a first current sensor 1, a second current sensor 2, a third current sensor 4, a voltage sensor 5, and a controller 6 as a diagnosing unit which diagnoses the presence or absence of an anomaly on the basis of currents detected by the first current sensor 1, the second current sensor 2 and the third current sensor 4, and a voltage detected by the voltage sensor 5 to detect an anomaly of a drive circuit 21.

Hereinbelow, the drive circuit anomaly diagnosing device F2 of the present example and the drive circuit 21 to which the anomaly diagnosing device F2 is applied will be described in detail. First, the drive circuit 21 will be described. As illustrated in FIG. 3, the drive circuit 21 has a configuration including a demagnetization circuit DC which demagnetizes a solenoid Sol, in addition to the drive circuit 20 in the first embodiment.

As illustrated in FIG. 3, the demagnetization circuit DC is provided with a demagnetizing switch DS which is disposed between the solenoid Sol and ground GND midway on a power supply line PSL, a demagnetization line DL which connects a point between a main switch MS and a power source Bat to a point between the solenoid Sol and the demagnetizing switch DS midway on the power supply line PSL, and a second diode D2 which is disposed midway on the demagnetization line DL with a forward direction corresponding to the direction from the ground side to the power source side. Further, the drive circuit 21 is provided with the controller 6 which controls opening and closing of the main switch MS which includes an N-channel MOSFET and the demagnetizing switch DS in response to input of a control command from an external control device (not illustrated). The main switch MS may include a P-channel MOSFET.

The demagnetizing switch DS in a closed state grounds the solenoid Sol to the ground GND. Thus, the drive circuit 21 is capable of adjusting a voltage applied to the solenoid Sol in a manner similar to the drive circuit 20 by opening and closing the main switch MS disposed on the power supply line PSL when the fail switch FS and the demagnetizing switch DS are maintained in an on state. Thus, the drive circuit 21 basically maintains the demagnetizing switch DS in an on state when adjusting a current value of the solenoid Sol to a current value designated by the control command input from the external control device. In order to adjust the voltage applied to the solenoid Sol so as to achieve the current value as per the control command, the drive circuit 21 sets an ON duty ratio of the main switch MS to open or close the main switch MS so that the current flowing through the solenoid Sol is as per the control command. In this manner, the drive circuit 21 adjusts the voltage applied to the solenoid Sol by opening and closing the main switch MS by PWM control to control the current flowing through the solenoid Sol with the demagnetizing switch DS kept on.

On the other hand, in order to rapidly demagnetize the solenoid Sol, the main switch MS is turned off with the fail switch FS kept off to stop power supply to the solenoid Sol from the power source Bat and the demagnetizing switch DS is also turned off to cut off the connection between the solenoid Sol and the ground GND on the downstream side with the fail switch kept on.

Figure 4:
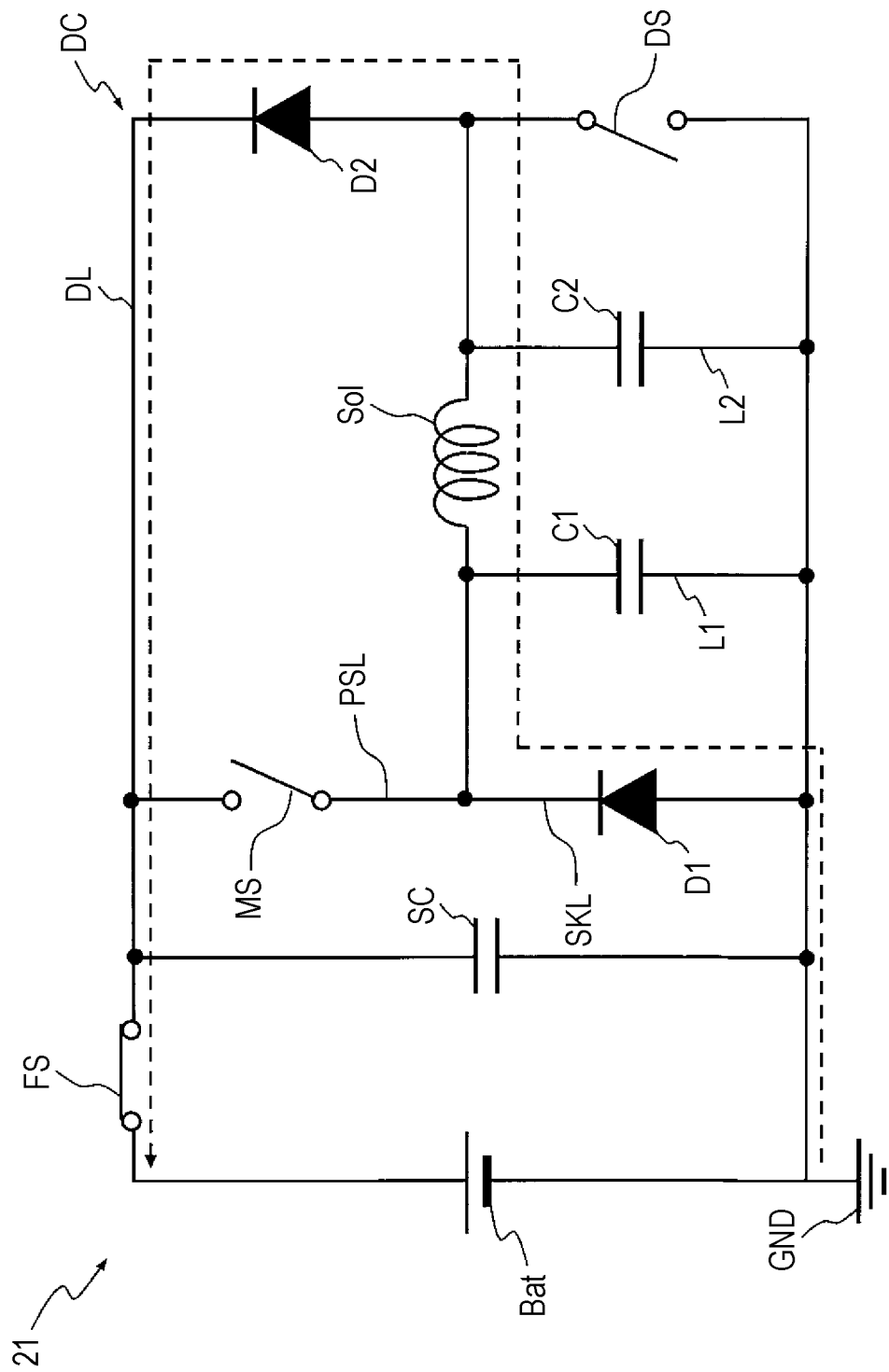
FIG. 4 is a diagram describing an operation of a drive circuit when a solenoid is demagnetized.

Accordingly, as illustrated in FIG. 4, a route in which the upper end (in the drawing) of the solenoid Sol is connected to the ground GND through the first diode D1 on the protection line SKL and the lower end (in FIG. 4) of the solenoid Sol is connected to the power source Bat through the demagnetization line DL becomes enabled by a counter electromotive force of the solenoid Sol. Under such a condition, a counter electromotive force is generated in the solenoid Sol, and a current flows in the direction from the ground GND to the power source Bat in the enabled circuit described above as indicated by an arrow in FIG. 4. Further, in this state, the power source Bat reversely energizes the solenoid Sol against the counter electromotive force of the solenoid Sol. Thus, the current flowing through the solenoid Sol promptly disappears, and the solenoid Sol is promptly demagnetized. When it is necessary to rapidly lower the current of the solenoid Sol even in current adjustment for the solenoid Sol by opening and closing the main switch MS, the demagnetizing switch DS may also be turned off together with turning off the main switch MS to demagnetize the solenoid Sol.

Specifically, as illustrated in FIG. 5, a voltage is applied to the solenoid Sol to increase current by turning on both the main switch MS and the demagnetizing switch DS to energize the solenoid Sol. The current flowing through the solenoid Sol is gradually reduced by turning off the main switch MS with the demagnetizing switch DS kept on, and the current flowing through the solenoid Sol is promptly reduced by turning off both the main switch MS and the demagnetizing switch DS. Thus, the drive circuit 21 of the present example is capable of demagnetizing the solenoid Sol with nigh responsivity.

The anomaly diagnosing device F2 is provided with the first current sensor 1 which detects a current upstream of the main switch MS midway on the power supply line PSL, the second current sensor 2 which detects a current between a connection point of the protection line SKL and a connection point of the first line L1 midway on the power supply line PSL, the third current sensor 4 which detects a current between the second line L2 and the demagnetizing switch DS midway on the power supply line PSL, the voltage sensor 5 which detects a voltage between the second line L2 and the demagnetizing switch DS midway on the power supply line PSL, and the controller 6 as the diagnosing unit which diagnoses the presence or absence of an anomaly on the basis of the currents detected by the first current sensor 1, the second current sensor 2 and the third current sensor 4, and the voltage detected by the voltage sensor 5.

When the demagnetizing switch DS is in an on state, the controller 6 compares a current I1 detected by the first current sensor 1 with a short-circuit current threshold Iα, and diagnoses that there is an anomaly and immediately turns off the fail switch FS when the current I1 is equal to or higher than the short-circuit current threshold Iα. Further, also when the current I1 detected by the first current sensor 1 is less than the short-circuit current threshold Iα, but equal to or higher than a first current threshold Iβ, the controller 6 diagnoses that there is an anomaly. Further, when the current I1 detected by the first current sensor 1 is less than the first current threshold Iβ, the controller 6 diagnoses that there is no anomaly.

Further, after the controller 6 diagnoses that there is an anomaly because the current I1 is less than the short-circuit current threshold Iα and equal to or higher than the first current threshold Iβ, the controller 6 compares a current I3 detected by the third current sensor 4 with the first current threshold Iβ. When the current I3 is equal to or higher than the first current threshold Iβ in the comparison, the controller 6 diagnoses the second diode D2 as having an anomaly. Further, after the controller 6 diagnoses that there is an anomaly because the current I1 is less than the short-circuit current threshold Iα and equal to or higher than the first current threshold Iβ, the controller 6 compares the current I3 with the first current threshold Iβ, and diagnoses the first diode D1, the first capacitor C1, or the solenoid Sol as having an anomaly when the current I3 is less than the first current threshold Iβ.

When the current I1 is less than the short current threshold Iα and equal to or higher than the first current threshold Iβ, and the controller 6 thus diagnoses that there is an anomaly, the controller 6 compares a current I2 detected by the second current sensor 2 with a second current threshold Iγ. When the current I2 is less than the second current threshold Iγ in the comparison, the controller 6 diagnoses the first diode D1 or the second diode D2 as having an anomaly. When the current I2 is equal to or higher than the second current threshold Iγ in the comparison, the controller 6 diagnoses the first capacitor C1, the solenoid Sol, or the main switch MS as having an anomaly.

When a voltage detected by the voltage sensor 5 is lower than a predetermined voltage threshold Vref during demagnetization in which the main switch MS and the demagnetizing switch DS are turned off, the controller 6 determines that the second capacitor C2 has an anomaly or the solenoid Sol has a short-circuit anomaly.

When the first diode D1, the first capacitor C1, and the second diode D2 are normal, a current flows to the solenoid Sol by turning on the demagnetizing switch DS and the main switch MS. Thus, the current I1 detected by the first current sensor 1 has a value proportional to the voltage applied the solenoid Sol, the voltage being adjusted by PWM control. Here, a case where one or more of the first diode D1, the first capacitor C1, and the second diode D2 are damaged and short-circuited will be considered. When such a short circuit occurs, the power source Bat is grounded to the ground GND by the protection line SKL, the first line L1, or the demagnetization line DL by turning on the main switch MS with the demagnetizing switch DS kept on. Under such a condition, a large current flows through the power supply line PSL, the protection line SKL or the first line L1, or the demagnetization line DL. When the first diode D1 is abnormal, and the first capacitor C1 and the second diode D2 are normal, a large current flows through the protection line SKL. When the first diode D1 and the second diode D2 are normal, and the first capacitor C1 is abnormal, a large current flows through the first line L1. Further, when the first diode D1 and the first capacitor C1 are normal, and the second diode D2 is abnormal, a large current flows through the demagnetization line DL. As described above, the short-circuit current threshold Iα is set at a large current value that is not generated when a current flows to the solenoid Sol and set at 30A in the present example. The second current threshold Iγ is also set at 3A in the present example in a manner similar to the first embodiment.

Thus, when the current I1 detected by the first current sensor 1 is equal to or higher than the first current threshold Iβ, it is recognized that one or more of the first diode D1, the first capacitor C1, the second diode D2, and the solenoid Sol have an anomaly. Thus, as described above, the controller 6 diagnoses the drive circuit 21 as having an anomaly.

In the present example, the controller 6 is provided with the third current sensor 4 to detect the current I3 to diagnose the presence or absence of an anomaly. However, the controller 6 may detect the temperature of the demagnetizing switch DS and similarly perform a diagnosis on the basis of the temperature. In an anomaly diagnosis for the second diode D2, since the demagnetizing switch DS is turned on to enable a current to pass therethrough, a large current flows also through the demagnetizing switch DS and the demagnetizing switch DS generates heat when the second diode D2 is short-circuited. In this manner, it is possible to detect that a large current flows when the second diode D2 is short-circuited also by detecting the temperature of the demagnetizing switch DS. Thus, as indicated by a dot-dash line of FIG. 3, a temperature sensor 7 which detects the temperature of the demagnetizing switch DS may be provided instead of the third current sensor 4, and an anomaly of the second diode D2 may be diagnosed when the temperature of the demagnetizing switch DS becomes equal to or higher than a temperature threshold. The temperature threshold may be set at a high temperature that is an impossible temperature for the demagnetizing switch DS in a normal state.

When the current I2 detected by the second current sensor 2 is less than the second current threshold Iγ under the condition where the current I1 is less than the short-circuit current threshold Iα and equal to or higher than the first current threshold Iβ, and any of the first diode D1, the first capacitor C1, the second diode D2, the solenoid Sol, and the main switch MS is thus diagnosed as having an anomaly, the controller 6 diagnoses the first diode D1 or the second diode D2 as having an anomaly.

Further, when the current I2 detected by the second current sensor 2 is equal to or higher than the second current threshold Iγ under the condition where the current I1 is less than the short-circuit, current threshold Iα and equal to or higher than the first current threshold Iβ, and any of the first diode D1, the first capacitor C1, the second diode D2, the solenoid Sol, and the main switch MS is thus diagnosed as having an anomaly, the controller 6 diagnoses the first capacitor C1, the solenoid Sol, or the main switch MS as having an anomaly as described above.

Aside from the above, when the second capacitor C2 or the solenoid Sol is short-circuited, a current drop speed is remarkably reduced as compared to the case where the second capacitor C2 is normal even by turning off the main switch MS and the demagnetizing switch DS to demagnetize the solenoid Sol. When the second capacitor C2 is short-circuited, a voltage cannot be applied against the counter electromotive force of the solenoid Sol even by turning off the main switch MS and the demagnetizing switch DS, and the current drop speed is remarkably reduced. Thus, the controller 6 diagnoses the second capacitor C2 as having an anomaly when the voltage detected by the voltage sensor 5 is less than the predetermined voltage threshold Vref during demagnetization. The voltage threshold Vref may be set to a value that is an impossible value when the second capacitor C2 is in a normal state. Further, every time the current I2 is sampled, the controller 6 may obtain the difference between the previous sampling data and the current sampling data, that is, a current difference in the current I2 and diagnose the second capacitor C2 as having an anomaly when the current difference is smaller than a predetermined threshold.

Then, when the controller 6 detects an anomaly, the controller 6 executes an operation for fail-safe in which the fail switch FS, the main switch MS, and the demagnetizing switch DS are turned off.

Further, when the current I1 is continuously maintained equal to or higher than the first current threshold Iβ for a predetermined time or when the current I2 is continuously maintained equal to or higher than the second current threshold Iγ for a predetermined time in spite of the fact that current supply to the solenoid Sol is stopped by turning off the main switch MS although the fail switch FS is on, but, the controller 6 determines that the main switch MS has an anomaly in a manner similar to the first embodiment. Then, the controller 6 turns off the main switch MS, the fail switch FS, and the demagnetizing switch DS. In this anomalous mode, although there is a high possibility that the main switch MS cannot be turned off, the controller 6 outputs a signal for turning off the main switch MS. The first current threshold Iβ is set at 4A in the present example as described above. In the present example, the three switches including the fail switch FS, the main switch MS, and the demagnetizing switch DS are provided and operated. Thus, the safety is further improved.

Although, in the above description, an anomaly diagnosis based on the current I1 detected by the first current sensor 1 is first performed, an anomaly diagnosis using the third current sensor 4 or the temperature sensor 7 is then performed, and an anomaly diagnosis based on the current I2 detected by the second current sensor 2 is performed at last, these diagnoses may be simultaneously performed without performing a stepwise anomaly diagnosis.

As described above, according to the drive circuit anomaly diagnosing device F2 of the present invention, the controller 6 performs an anomaly diagnosis on the basis of the currents I1, I2 detected by the first current sensor 1 and the second current sensor 2, the current I3 detected by the third current sensor 4 or the temperature detected by the temperature sensor 7, and the voltage detected by the voltage sensor 5. Thus, even while the drive circuit 21 is driving the solenoid Sol, it is possible to diagnose the presence or absence of an anomaly in the drive circuit 21.

Thus, the drive circuit anomaly diagnosing device F2 of the present invention is most suitable for anomaly diagnosis on a drive circuit of a solenoid valve which is used in a shock absorber with a damping force adjusting function used in a suspension in a vehicle and capable of timely detecting an anomaly during traveling of the vehicle. In the case of application to a vehicle, when the anomaly diagnosing device F2 detects an anomaly, the anomaly diagnosing device F2 may send a command for stopping control to the control device which controls the drive circuit 21, or may turn on a warning light or generate an alarm sound so that an occupant of the vehicle recognizes the anomaly.

Further, the drive circuit anomaly diagnosing device F2 of the present example diagnoses the presence or absence of an anomaly in the drive circuit 21 on the basis of the currents detected by the first current sensor 1 and the second current sensor 2, and the current I3 detected by the third current sensor 4 or the temperature detected by the temperature sensor 7. Thus, it is possible to detect an anomaly in any of the first diode D1, the first capacitor C1, the second diode D2, the solenoid Sol, and the main switch MS.

Further, the drive circuit anomaly diagnosing device F2 of the present example diagnoses the presence or absence of an anomaly in the drive circuit 21 on the basis of the currents detected by the first current sensor 1 and the second current sensor 2, the current I3 detected by the third current sensor 4 or the temperature detected by the temperature sensor 7, and the voltage detected by the voltage sensor 5.

Further, the anomaly diagnosing device F2 of the present example diagnoses the second capacitor C2 or the solenoid Sol as having an anomaly when a detected value of the voltage detected by the voltage sensor 5 is low during demagnetization. When the anomaly diagnosing device F2 is configured in this manner, it is possible to identify and diagnose an anomaly of the second capacitor C2 or the solenoid Sol in the drive circuit 21.

Further, when an anomaly of the drive circuit 21 is recognized, the controller 6 achieves fail-safe by turning off the fail switch FS, the main switch MS, and the demagnetizing switch DS. Thus, even in the situation where any of the fail switch FS, the main switch MS, and the demagnetizing switch DS is snort-circuited, it is possible to reliably prevent an overcurrent from flowing to the solenoid Sol.

The anomaly diagnosing devices F1, F2 for the drive circuits 20, 21 of the present invention can be used for a drive circuit other than the drive circuit that drives a solenoid valve of a shock absorber, and may also be applied to a drive circuit that drives a magnetostrictive actuator or a drive circuit that drives a solenoid actuator. Further, when the shock absorber is a magnetic viscous shock absorber including a magnetic viscous fluid as a hydraulic liquid, the anomaly diagnosing devices F1, F2 can also be applied to a drive circuit that supplies power to a solenoid that applies a magnetic field to a passage through which the magnetic viscous fluid passes during expansion and contraction of the shock absorber.

Although the preferred embodiments of the present invention have been described in detail above, conversions, modifications, and changes can be made without departing from the range of the claims.

The invention claimed is:

1. A drive circuit anomaly diagnosing device for a drive circuit, the drive circuit including a power supply line on which a solenoid is disposed midway, the power supply line connecting a power source to ground, a main switch disposed on the power source side relative to the solenoid midway on the power supply line, a protection line connecting a point between the main switch and the solenoid to the ground, a first diode disposed midway on the protection line with a forward direction corresponding to a direction from the ground side to the power source side, and a first capacitor interposed on a first line connecting one end on the power source side of the solenoid to the ground midway on the power supply line, the drive circuit being configured to supply power to the solenoid, the drive circuit anomaly diagnosing device comprising:
   a first current sensor configured to detect a current upstream of the main switch midway on the power supply line, and
   a second current sensor configured to detect a current flowing from a connection point with the protection line to the solenoid midway on the power supply line, wherein
   the drive circuit includes a second capacitor interposed on a second line connecting the other end on the ground side of the solenoid to the ground midway on the power supply line, a demagnetizing switch disposed between the solenoid and the ground midway on the power supply line, a demagnetization line connecting a point between the main switch and the power source to a point between the solenoid and the demagnetizing switch midway on the power supply line, and a second diode disposed midway on the demagnetization line with a forward direction corresponding to the direction from the ground side to the power source side, the drive circuit anomaly diagnosing device comprises a third current sensor configured to detect a current between the second line and the demagnetizing switch midway on the power supply line or a temperature sensor configured to detect a temperature of the demagnetizing switch, and the drive circuit anomaly diagnosing device detects an anomaly of the drive circuit on the basis of the currents detected by the first current sensor and the second current sensor, and the current detected by the third current sensor or the temperature detected by the temperature sensor.

2. The drive circuit anomaly diagnosing device according to claim 1, comprising a voltage sensor configured to detect a voltage between the second line and the demagnetizing switch midway on the power supply line, wherein the drive circuit anomaly diagnosing device detects an anomaly of the drive circuit on the basis of the currents detected by the first current sensor and the second current sensor, the current detected by the third current sensor or the temperature detected by the temperature sensor, and the voltage detected by the voltage sensor.

3. The drive circuit anomaly diagnosing device according to claim 2, wherein the drive circuit anomaly diagnosing device diagnoses the second capacitor or the solenoid as having an anomaly when the voltage detected by the voltage sensor is lower than a voltage threshold during demagnetization.

4. The drive circuit anomaly diagnosing device according to claim 1, wherein the drive circuit anomaly diagnosing device diagnoses the first diode or the second diode as having an anomaly when the current detected by the first current sensor is equal to or higher than a first current threshold and the current detected by the second current sensor is lower than a second current threshold.

5. The drive circuit anomaly diagnosing device according to claim 4, wherein the drive circuit includes a fail switch disposed on the power source side relative to the main switch on the power supply line, and the drive circuit anomaly diagnosing device turns off the fail switch when the current detected by the first current sensor is equal to or higher than a short-circuit current threshold larger than the first current threshold.

6. A drive circuit anomaly diagnosing device for a drive circuit, the drive circuit including a power supply line on which a solenoid is disposed midway, the power supply line connecting a power source to ground, a main switch disposed on the power source side relative to the solenoid midway on the power supply line, a protection line connecting a point between the main switch and the solenoid to the ground, a first diode disposed midway on the protection line with a forward direction corresponding to a direction from the ground side to the power source side, and a first capacitor interposed on a first line connecting one end on the power source side of the solenoid to the ground midway on the power supply line, the drive circuit being configured to supply power to the solenoid, the drive circuit anomaly diagnosing device comprising:

a first current sensor configured to detect a current upstream of the main switch midway on the power supply line, a second current sensor configured to detect a current flowing from a connection point with the protection line to the solenoid midway on the power supply line, wherein the drive circuit anomaly diagnosing device diagnoses the first capacitor, the solenoid, or the main switch as having an anomaly when the current detected by the first current sensor is equal to or higher than a first current threshold and the current detected by the second current sensor is equal to or higher than a second current threshold.

\* \* \* \* \*